(12) United States Patent
Hsu et al.

(10) Patent No.: US 6,735,115 B2
(45) Date of Patent: May 11, 2004

(54) NONVOLATILE SEMICONDUCTOR MEMORY DEVICE HAVING DIVIDED BIT LINES

(75) Inventors: Ching-Hsiang Hsu, Hsinchu (TW); Ching-Song Yang, Chang-Hua Hsien (TW)

(73) Assignee: eMemory Technology Inc., Hsin-Chu (TW)

( * ) Notice: Subject to any disclaimer, the term of this patent is extended or adjusted under 35 U.S.C. 154(b) by 222 days.

(21) Appl. No.: 09/956,212

(22) Filed: Sep. 18, 2001

(65) Prior Publication Data

US 2003/0053339 A1 Mar. 20, 2003

(51) Int. Cl.[7] .............................................. G11C 16/04
(52) U.S. Cl. .......................... 365/185.11; 365/185.13; 365/185.17; 365/185.18; 365/185.28; 365/185.29; 257/315

(58) Field of Search ..................... 365/185.11, 185.13, 365/185.17, 185.18, 185.28, 185.29, 185.01

(56) References Cited

U.S. PATENT DOCUMENTS 5,847,995 A  * 12/1998  Kobayashi et al. .... 365/185.18
5,898,616 A  *  4/1999  Ono ..................... 365/185.17

* cited by examiner

Primary Examiner—Hoai Ho
(74) Attorney, Agent, or Firm—Winston Hsu

(57) ABSTRACT

A non-volatile semiconductor memory device having divided bit lines. A main bit line is controlled by at least one bit line selection device to transfer its potential to a selected sub bit line, such that memory cells in a selected sector work and overloading of the bit line generated by a parasitic capacitance can be prevented. The memory cells and the bit line selection device are arranged in parallel in a P-well and a N-well, respectively, thereby preventing disturbances during programming or erasing the bit line.

34 Claims, 8 Drawing Sheets

NONVOLATILE SEMICONDUCTOR MEMORY DEVICE HAVING DIVIDED BIT LINES

BACKGROUND OF THE INVENTION

1. Field of the Invention

The present invention relates to a semiconductor memory device. More specifically, the present invention relates to a Nonvolatile semiconductor memory device having divided bit lines.

2. Description of the Related Art

In a non-volatile memory, a flash memory can be programmed by channel hot electron injection, also known as Fowler-Nordheim tunneling. In programming, electrons are driven into a floating gate to increase a critical voltage of a memory cell. In erasing, the electrons are drawn from the floating gate to decrease the critical voltage of the memory cell.

FIG. 1A shows a configuration of bit lines of a conventional flash memory. FIG. 1B shows circuit schematic drawing of a conventional flash memory. The conventional flash memory has an N-type substrate 10, a deep P-well 12 and an N-well 14. A plurality of memory cells is formed inside the N-well 14. For example, a memory cell 16 includes a drain 18, a gate 20 and a source 22. The drain 18 and the source 22 are formed of N-type ion regions. The gate consists of a control gate 24 that connects to a gate voltage and a floating gate 26 located under the control gate 24. The source 22 is surrounded by a P-type ion region 28. The bit line 30 penetrates a source shown as a reference numeral 22 and a P-type ion region shown as a reference numeral 28.

All the above memory cells are formed on the same N-well 14. When a programming process is performed, the power from the bit line affects the memory cells connected to the same bit line but not selected. For example, when 5V are applied to the bit line (source) and 0V to the word line (gate), slightly less than 5V exist on the drain of the non-selected memory cells. This forms M-1 disturbances in the selected sector and M* P/E (program/erase) cycle times *(N-1) if the device has N sectors each of which has M word lines, wherein M is equal to the number of the memory cells. Therefore, the total disturbances during programming the bit line is M* P/E cycle times *(N-1)+(M-1).

Performance of an erasing process also generates disturbances. The sectors are erased wholly, not respectively. When -8V are applied to the drain, the voltage for the whole N-well is maintained at about -8V Therefore, P/E cycle times *(N-1) of disturbances are generated in other sectors during erasing the bit line.

The disturbances generated during programming or erasing the bit line affect data storage of the memory cell. Furthermore, connection between a source and P-type ion region in each memory cell by the bit line forms a parasitic capacitance 32 at the source, as shown in FIG. 1B. In a reading process, the capacitance burdens the bit line and thus lowers the reading speed.

SUMMARY OF THE INVENTION

It is one object of the present invention to provide a non-volatile semiconductor memory device having divided bit lines to prevent the above overloading of the bit lines from being generated.

It is another object of the present invention to provide a non-volatile semiconductor memory device having divided bit lines to effectively reduce disturbances when programming or erasing bit lines.

To achieve the above and other objects of the present invention, a non-volatile semiconductor memory device having divided bit lines is provided. The memory device includes a substrate, a plurality of memory cells, at least one bit line selection device, at least one isolation structure, a main bit line and at least one sub bit line.

The substrate has an N-type region, a deep P-well and an N-well from the bottom to the top. The memory cells are located inside the N-well, with a designated number of the memory cells form a sector. The bit line selection device is located inside the N-well and between sectors to control operation of any sector. An isolation structure is located between the sector of the memory cells and the bit line selection device. The main bit line is electrically connected to one end of the bit line selection device. The sub bit line is electrically connects all memory cells in each sector to the other end of the bit line selection device, respectively.

Since the sub bit line is controlled by the bit line selection device, the bit line voltage for the memory cells in the non-selected sector is in the floating state, such that the memory cells in the non-selected sector are in a non-operational state and no parasitic capacitance is generated. Thereby, overloading of the bit line can be avoided.

Each of the above memory cells has a source, a gate and a drain. The source consists of an N-type ion region surrounded by a P-type ion region. A short circuit connection between the source and the P-type ion region is formed. The short circuit connection can be also formed by a metal layer penetrating the source and the P-type ion region. Alternatively, the short circuit connection can be formed by a metal layer connecting an exposed source to the P-type ion region. The drain consists of an N-type ion region and connects to the P-type ion region. Alternatively, the drain comprises an N+ ion region and an N– ion region that is located between the N+ ion region and the P-type ion region. In one embodiment, the drain comprises an N+ ion region and an N– ion region than surrounds the N+ ion region and connects to the P-type ion region. In another embodiment, the drain region comprises an N+ ion region and an N-type field oxide located between the N+ ion region and the P-type ion region.

The sub bit line and the main bit line can be made of metal or a metallic compound. Every sixteen or more of the memory cells form a sector. Each memory cell has a gate, a source and a drain. A word line voltage, a bit line voltage and a drain voltage are applied to the gate, the bit line and the drain, respectively. When an erasing process is performed, a high level of word line voltage and a drain voltage relatively lower than the word line voltage are provided, keeping the bit line voltage in a suspended state and a deep P-well at a voltage relatively lower than the word line voltage. When a programming process is performed, a low level of word line voltage and the bit line voltage relatively higher than the word line voltage are provided, keeping the drain in the suspended state and the deep P-well at a voltage relatively higher than the word line voltage. When a reading process is performed, a higher level of the word line voltage, a drain voltage relatively lower than the word line voltage, a bit line voltage relatively lower the drain voltage, and a deep P-well voltage relatively lower than the drain voltage are provided.

In a second aspect of the present invention, a non-volatile semiconductor memory device having divided bit lines is provided. The memory device includes a substrate, a plurality of memory cells, at least one bit line selection device, at least one isolation structure, a main bit line and at least one bit line.

The substrate includes an N-type region, a deep P-well and a combined well from the bottom to the top. The combined well consists of a P-well and an N-well in parallel. The memory cells are located inside the N-well, wherein a designated number of the memory cells form a sector. The bit line selection device is located inside the P-well and between sectors to control operation of any sector. An isolation structure is located between the P-well and the N-well to isolate the sector of the memory cells from the bit line selection device. The main bit line is electrically connected to one end of the bit line selection device. The sub bit line electrically connects all memory cells in each sector to the other end of the bit line selection device, respectively.

The P-well and the N-well are arranged in parallel in the combinedwell. The bit line selection device is located in the P-well and the memory cells are in the N-well, such that it is not necessary to share the same N-well and thus reduced disturbances generated during programming or erasing the bit lines can be achieved.

Each of the above memory cells has a source, a gate and a drain. The source consists of an N-type ion region surrounded by a P-type ion region. A short circuit connection between the source and the P-type ion region is formed. The short circuit connection can be also formed by a metal layer penetrating the source and the P-type ion region. Alternatively, the short circuit connection can be formed by a metal layer connecting an exposed source to the P-type ion region. The drain consists of an N-type ion region and connects to the P-type ion region. Alternatively, the drain comprises an N+ ion region and an N− ion region that is located between the N+ ion region and the P-type ion region. In one embodiment, the drain comprises an N+ ion region and an N− ion region than surrounds the N+ ion region and connects to the P-type ion region. In another embodiment, the drain region comprises an N+ ion region and an N-type field oxide that located between the N+ ion region and the P-type ion region.

The sub bit line and the main bit line can be made of metal or a metallic compound. Every 16 or more of the memory cells form a sector. Each memory cell has a gate, a source and a drain. A word line voltage, a bit line voltage and a drain voltage are applied to the gate, the bit line and the drain, respectively. When an erasing process is performed, a high level of word line voltage and a drain voltage relatively lower than the word line voltage are provided, keeping the bit line voltage in a suspended state and a deep P-well at a voltage relatively lower than the word line voltage. When a programming process is performed, a low level of word line voltage is applied and the bit line voltage is relatively higher than the word line voltage, keeping the drain in the suspended state and the deep P-well at a voltage relatively higher than the word line voltage. When a reading process is performed, a higher level of the word line voltage, a drain voltage relatively lower than the word line voltage, a bit line voltage relatively lower the drain voltage, and a deep P-well voltage relatively lower than the drain voltage are provided.

BRIEF DESCRIPTION OF THE DRAWINGS

It is to be understood that both the foregoing general description and the following detailed description are exemplary, and are intended to provide further explanation of the invention as claimed.

The accompanying drawings are included to provide a further understanding of the invention, and are incorporated in and constitute a part of this specification. The drawings illustrate embodiments of the invention and, together with the description, serve to explain the principle of the invention. In the drawings.

DESCRIPTION OF THE PREFERRED EMBODIMENT

Figure 1A:
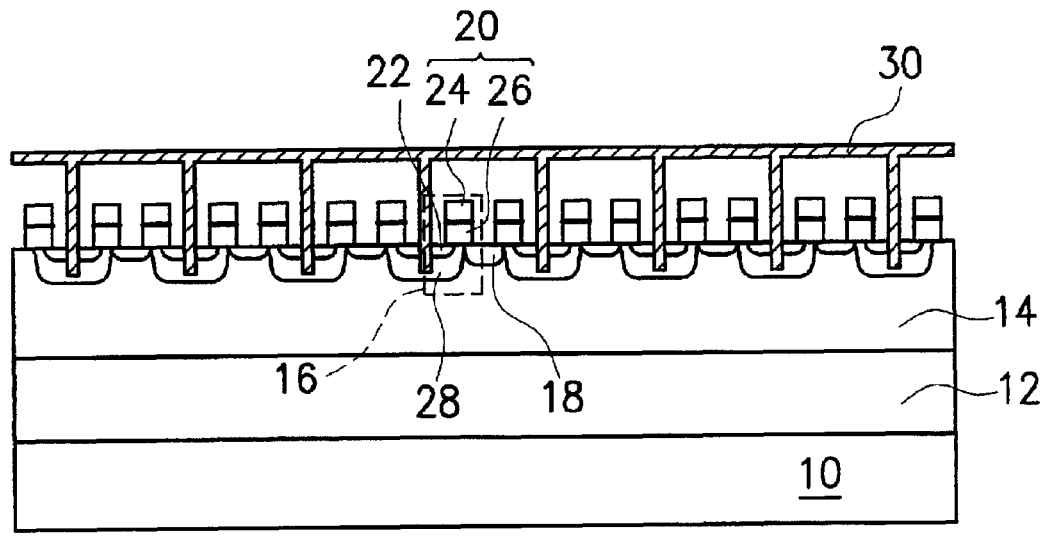
FIG. 1A shows a configuration of bit lines of a conventional flash memory.
Figure 1B:
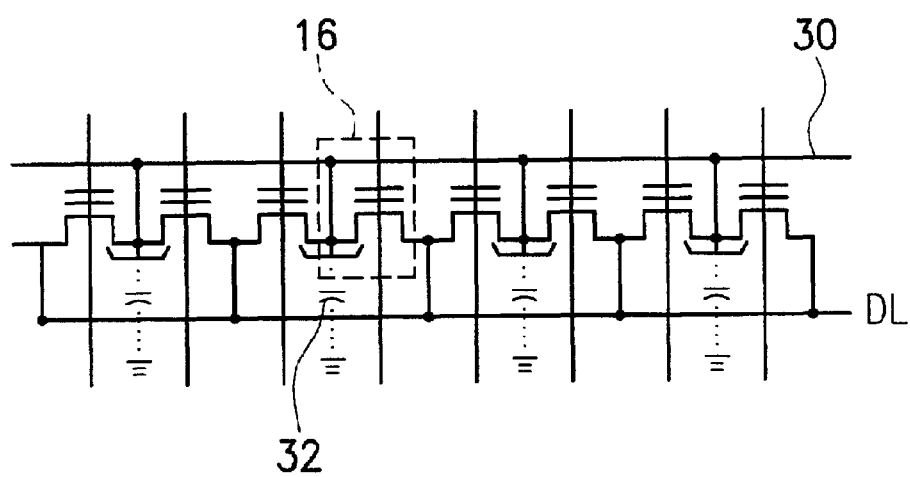
FIG. 1B shows circuit layout of a conventional flash memory.

Reference will now be made in detail to the present preferred embodiments of the invention, examples of which are illustrated in the accompanying drawings. Whenever possible, the same reference numbers are used in the drawings and the description to refer to the same or like parts.

Figure 2A:
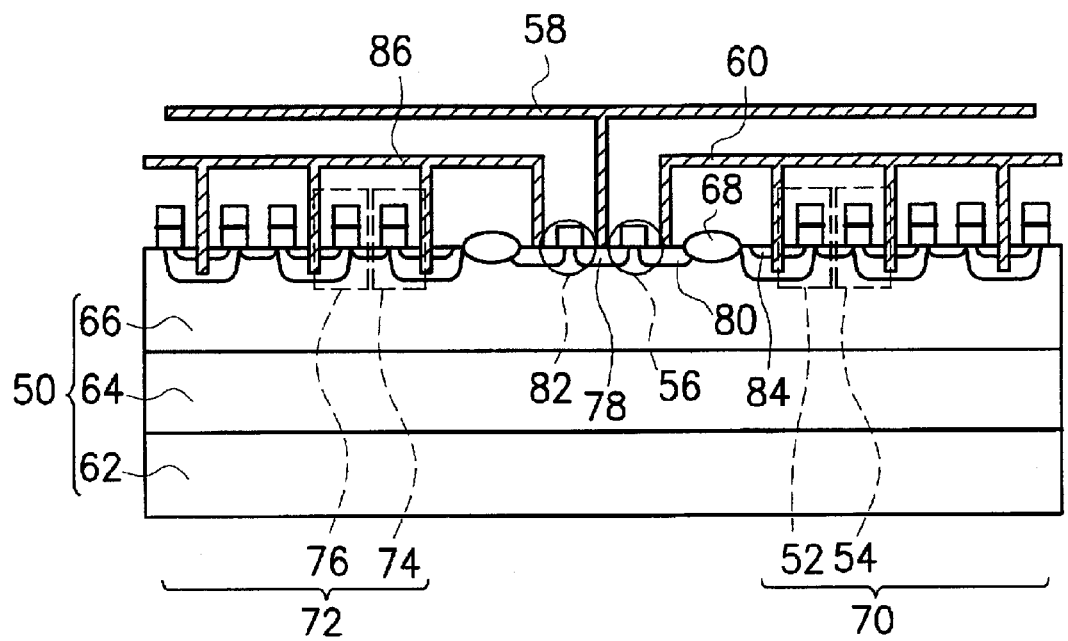
FIGS. 2A and 2B show a non-volatile semiconductor memory device having divided bit lines according to one preferred embodiment of the present invention.
Figure 2B:
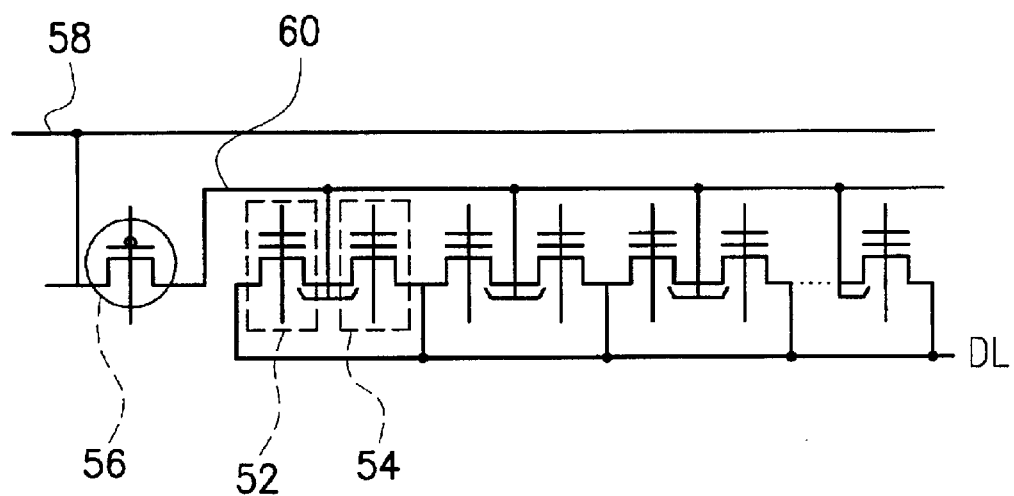

FIGS. 2A and 2B show a non-volatile semiconductor memory device having divided bit lines according to one preferred embodiment of the present invention.

The non-volatile semiconductor memory device of this embodiment of the present invention includes a substrate 50, a plurality of memory cells (such as 52 and 54), at least a bit line selection device 56 such as a P channel MOS transistor, at least an isolation structure 68 such as an isolation made of oxide, a main bit line 58 and at least a sub bit line 60.

The substrate 50 has an N-type region 62, a deep P-well 64 and an N-well 66. Memory cells 52 and 54 are located inside the N-well 66. A sector of memory cells can consist of 16, 32, 64 or more than 64 memory cells. As shown in Figures, the memory cells 52 and 54 form a sector 70 and memory cells 74 and 76 form a sector 72. The bit line selection device 56 such as a P channel MOS transistor is located inside the N-well 66 and between each sector of the memory cells to control all sectors of the memory cells. The isolation structure 68 is located between the memory cell 52 and the bit line selection device 56. The bit line has one end 78, which is a P-type region and another end 80, which is also a P-type region. The main bit line 58 is electrically connected to one end 78 of the bit line selection device 56. The sub bit line 60 is electrically connected to each sector of the memory cells, such as a source 84 of the memory cell 52 in the sector 70, to the end 80 of the bit line selection device 56. The above main bit line and the sub bit line can be made of metal or a metallic compound.

With reference to FIG. 2A, no voltage is applied to the main bit line 58. If the memory cell 52 is read, then the bit line selection device 56 is connected and the other control bit line selection device 82 is disconnected, such that the sub bit line 60 and the main bit line 58 have the same voltages and the sub bit line 86 is in a suspended state. The memory cells that are designated to not be operated do not generate any parasitic capacitance and bit line loading, so that the loading of the main bit line can be reduced when the reading process is performed.

The above configuration performs programming by using the same N-well. However, when 5V are applied to the main bit line 58, about 5V are formed on the N-well. This forms M−1 disturbances in the selected sector and M* P/E (program/erase) cycle times *(N−1) if the device has N sectors each of which has M word lines, M being equal to the number of the memory cells. Therefore, the total disturbances during programming the bit line is M* P/E cycle times *(N−1)+(M−1).

Also, when the erasing process is performed, disturbances of the bit line are erased wholly, not respectively. Disturbances of the bit line are erased P/E cycle times * (N−1) in other sectors.

Figure 3A:
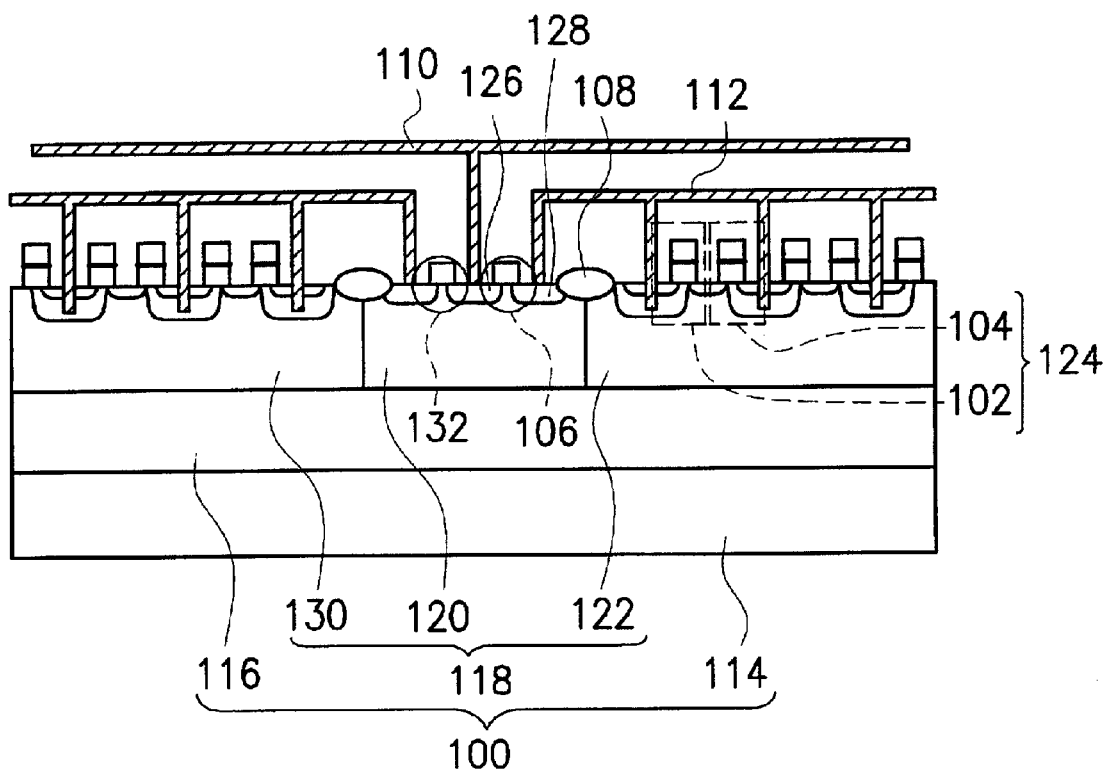
FIGS. 3A and 3B show a non-volatile semiconductor memory device having divided bit lines according another preferred embodiment of the present invention.
Figure 3B:
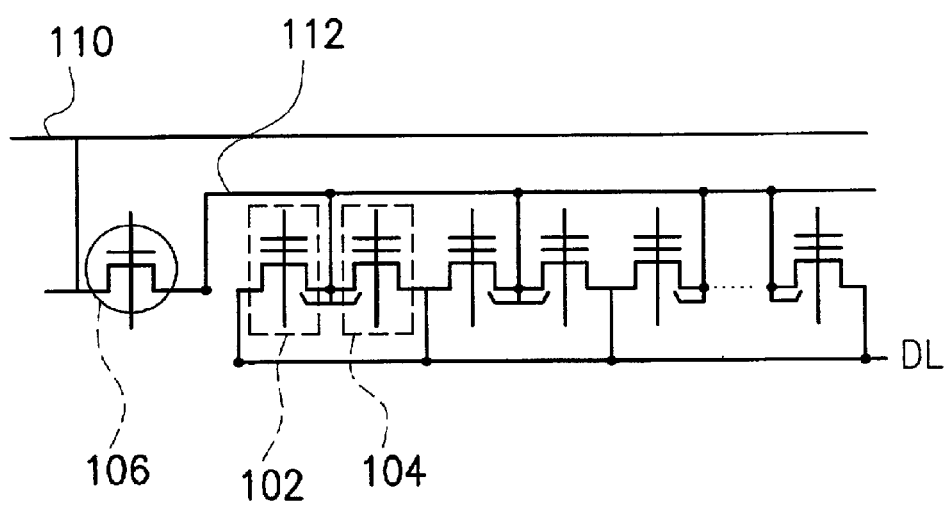

FIGS. 3A and 3B show a non-volatile semiconductor memory device having divided bit lines according another preferred embodiment of the present invention, which can provide reduced disturbance when reading and erasing the bit line.

The non-volatile semiconductor memory device of this embodiment of the present invention includes a substrate 100, a plurality of memory cells 102 and 104, a bit line selection device 106, an isolation structure 108, a main bit line 110 and a sub bit line 112.

The substrate 100, different from the substrate 50 shown in FIG. 2A, has an N-type region 114, a deep P-well 116 and a combined well region 118. The combined well region 118, different from the single N-well 14 shown in FIG. 2A, consists of a P-well 120 and an N-well 122 in parallel. The memory cells 102 and 104 are arranged inside the N-well 122. Sixteen or more memory cells form a sector. Additionally, one or more sectors are formed on the same N-well. For example, two adjacent sectors are formed on the same N-well. The bit line selection device 106 such as N channel MOS transistor is provided in the P-well 120, which is different from FIG. 2A, and located between sectors to control the operation of any sector. The isolation structure 108 is located between the P-well 120 and the N-well 122 to isolate a sector, such as a sector 124 of memory cells 102 and 104, from the bit line selection device 106. The main bit line 110 is electrically connected to one end 126 of the bit line selection device 106. The sub bit line 112 is electrically connected to a source of the memory cell in the sector 124 and to the other end 128 of the bit line selection device 106.

Further, the P-well 120 also provides isolation between N-wells 122 and 130, such that each sector of memory cells are in different N-wells and isolated by the P-well. Therefore, the disturbances caused by reading and erasing the bit line using the same N-well in the conventional process can be prevented. Only M−1 programming bit line disturbances are generated in the same N-well during a programming process. The disturbances generated in the present memory device are greatly reduced compared to the conventional one.

Figure 4A:
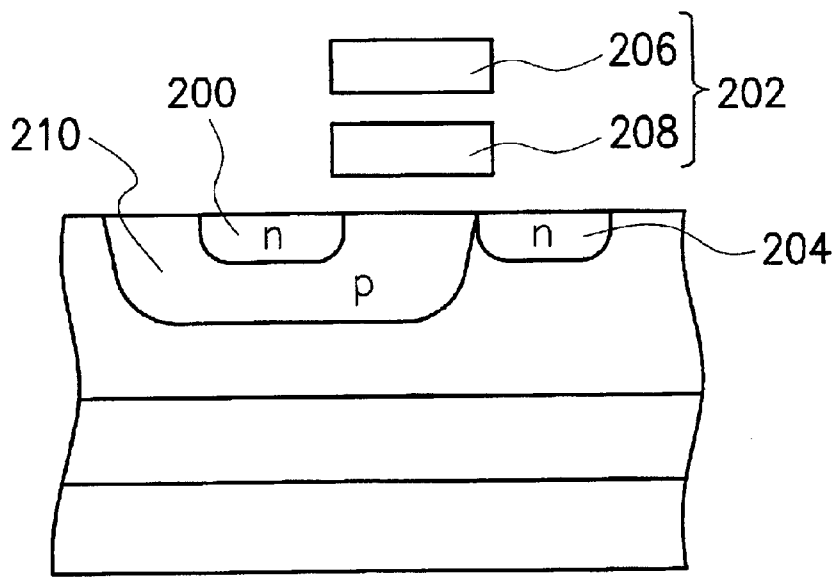
FIG. 4A shows locally enlarged view of the memory device of FIG. 3A.

The memory cell indicated by reference numeral 52 in FIG. 2A or 102 in FIG. 3A is not limited to the above specified embodiments. The memory cell 102 located in the N-well has a source 200, a gate region 202 and a drain 204 as shown in FIG. 4A. The gate 202 includes a control gate 206 and a floating gate 208 thereunder. The source 200 consists of an N-type ion region surrounding by a P-type ion region 210. The drain 204 consists of an N-type region adjacent to the P-ion-type region 210.

Figure 4B:
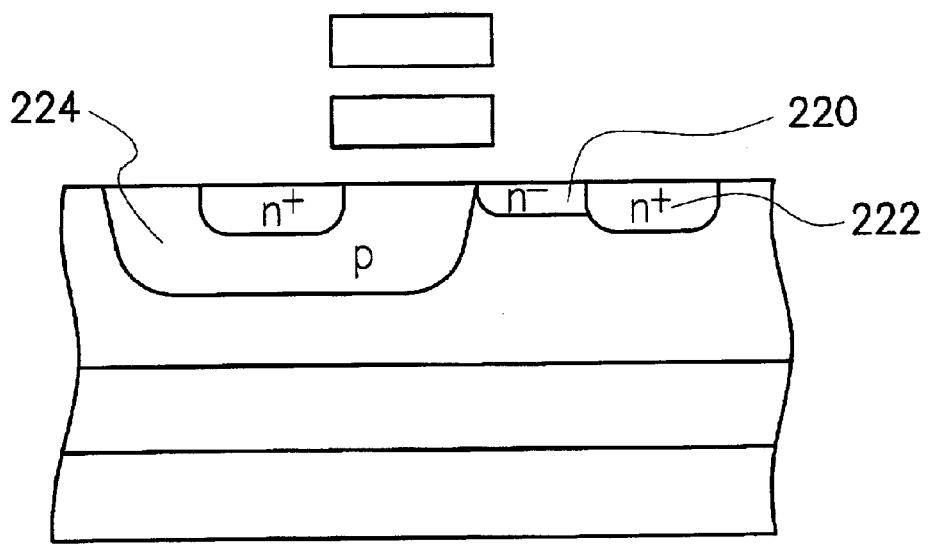
FIG. 4B shows another type of the memory cell.

FIG. 4B shows another type of the memory cell. The memory device shown in FIG. 4B has the same gate and source as those shown in FIG. 4A. The drain in this embodiment includes an N− ion region 220 and an N+ ion region 222. The N− ion region 220 is located between the N+ ion region 222 and the P-type ion region 224.

Figure 4C:
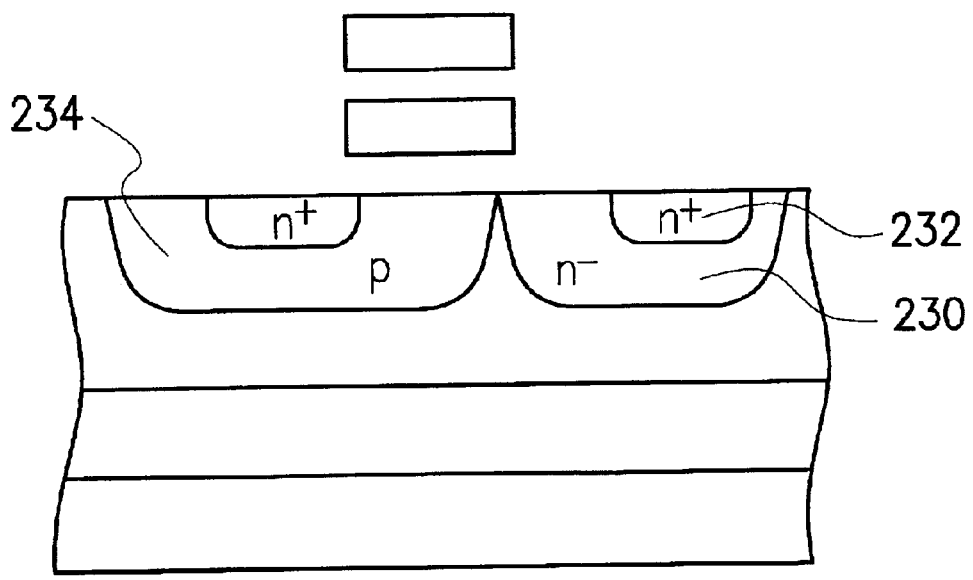
FIG. 4C shows still another type of the memory cell.

FIG. 4C shows still another type of the memory cell. The memory cell shown in FIG. 4C has the same gate and source as those shown in FIG. 4A. The drain in this embodiment includes an N− ion region 230 and an N+ ion region 232. However, FIG. 4C differs from FIG. 4B in that the N− ion region 230 surrounds the N+ ion region 232 and connects to the P-type ion region 234.

Figure 4D:
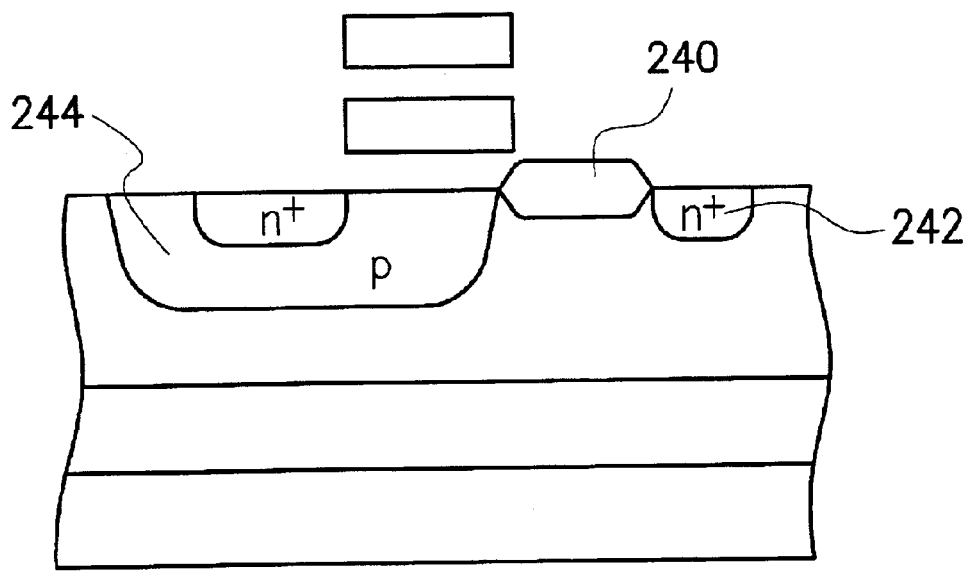
FIG. 4D shows further another type of the memory cell.

FIG. 4D shows yet another type of the memory cell. The memory cell shown in FIG. 4C has the same gate and source as those shown in FIG. 4A. The drain in this embodiment includes an N-type field oxide 240 and an N+ ion region 242. The N-type field oxide 240 is located between N+ ion region 242 and a P-type ion region 244.

Figure 5A:
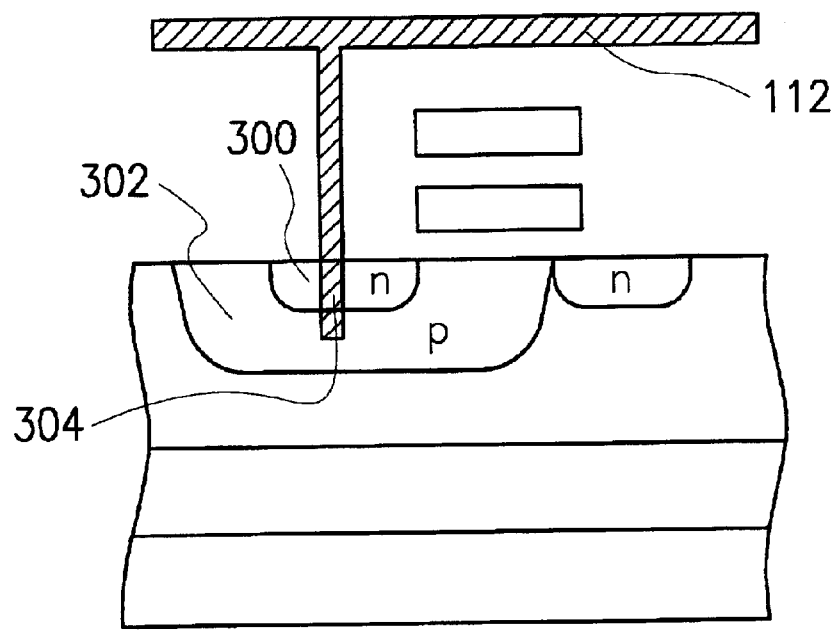
FIG. 5A is an enlarged view showing a sub bit line 112 connected to a memory cell in FIG. 3A.
Figure 5B:
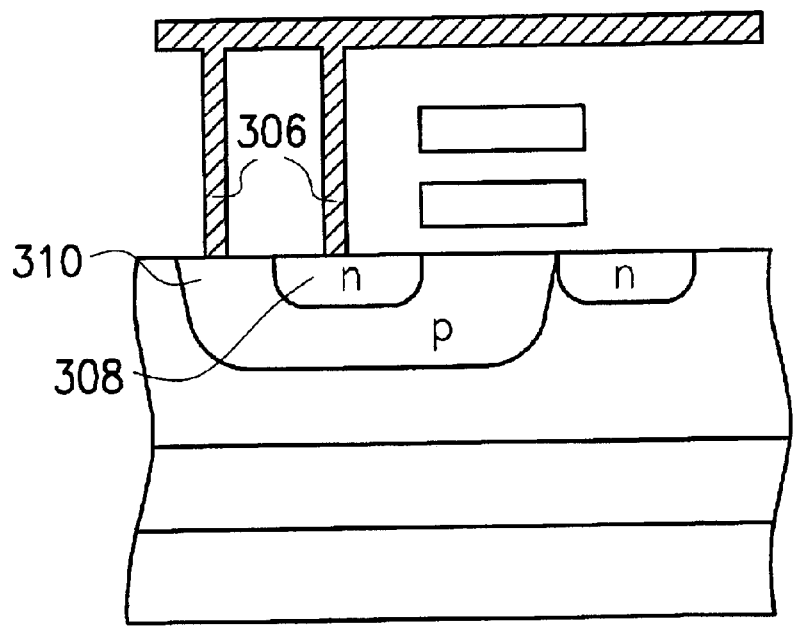
FIG. 5B shows another connection for the bit lines.

FIG. 5A is an enlarged view showing a sub bit line 112 that is connected to a memory cell in FIG. 3A. A short circuit connects a source 300 and a P-type ion region 302. For example, a metal layer 304 connected to the bit line 112 penetrates the source 300 and the P-type ion region 302, as shown in FIG. 5A. Alternatively, a metal layer 306 connects the exposed source 308 to the P-type ion region 310 to form a short circuit connection as shown in the FIG. 5B.

Figure 6A:
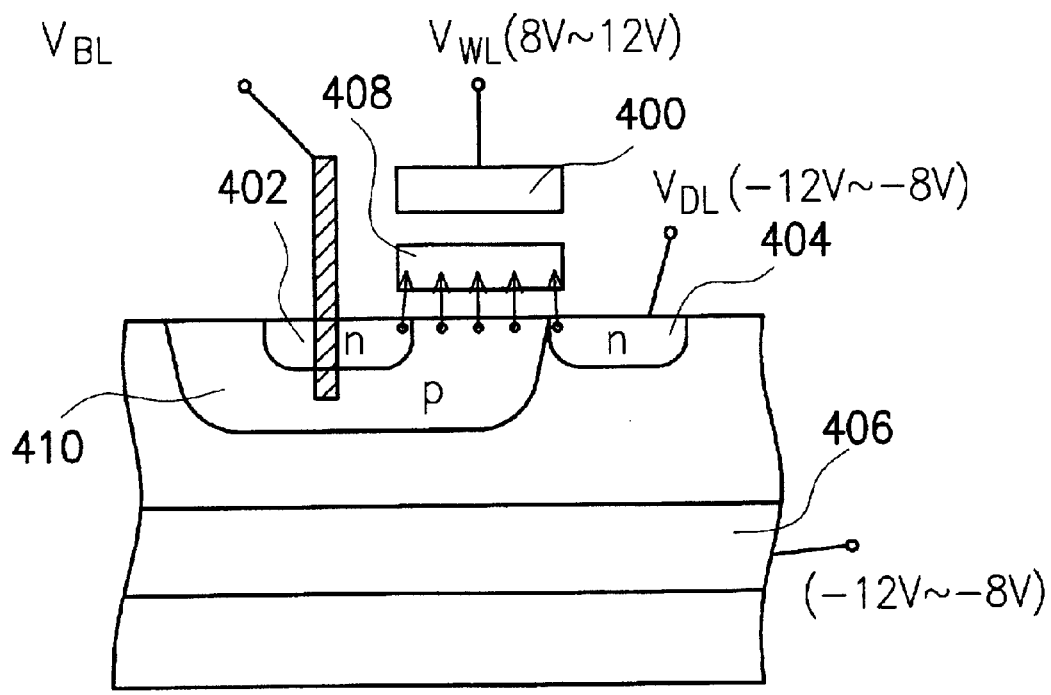
FIGS. 6A–6C show programming, erasing and reading of a non-volatile semiconductor memory device having divided bit lines according to the present invention.
Figure 6B:
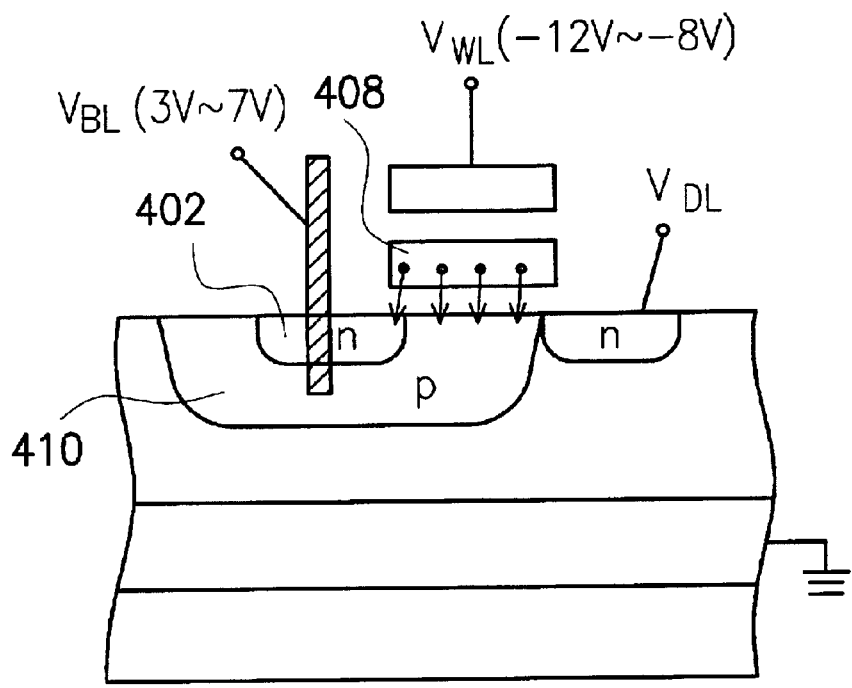
Figure 6C:
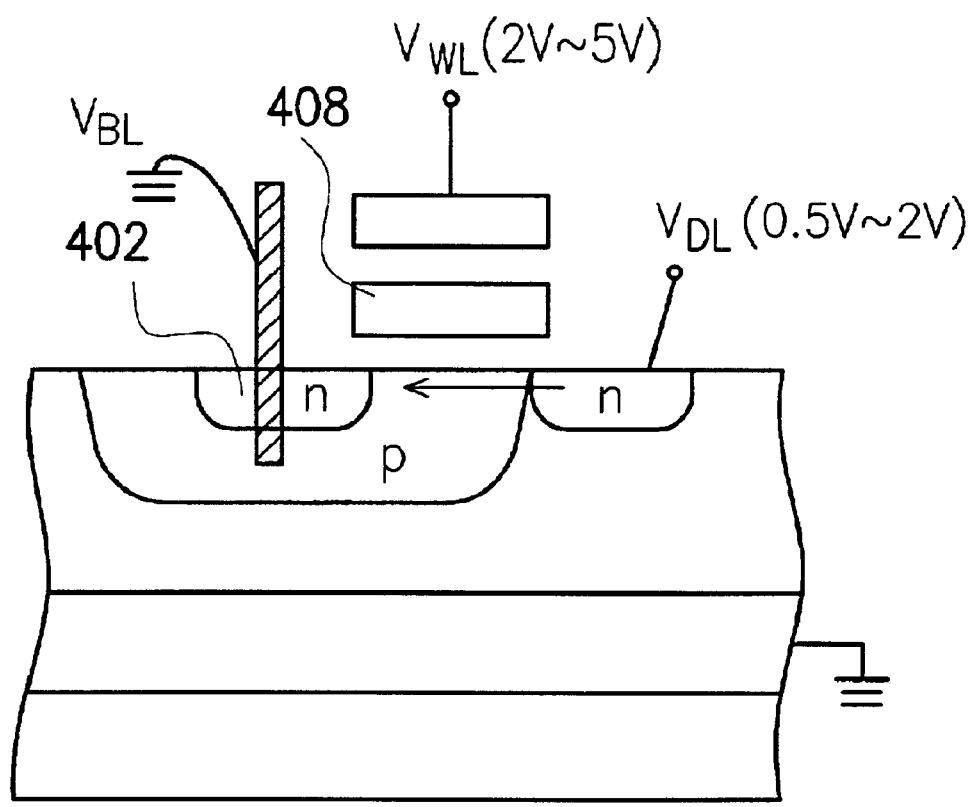

FIGS. 6A–6C show programming, erasing and reading of a non-volatile semiconductor memory device having divided bit lines according to the present invention. In FIG. 6A, a word line voltage $V_{WL}$, a bit line voltage $V_{BL}$ and a drain voltage $V_{DL}$ are applied to a gate 400, a source 402 and a drain 404, respectively.

When the erasing process is performed, as shown in FIG. 6A, a high level of word line voltage $V_{WL}$ such as 8V~12V and a drain voltage $V_{DL}$ relatively lower than the word line voltage $V_{WL}$ such as −12V~−8V are provided, keeping the bit line voltage $V_{BL}$ in a suspended state and a deep P-well 406 at the same voltage as the drain such as −12V~−8V Under the operation recited above, electrons move into a floating gate 408.

When a programming process is performed as shown in FIG. 6B, a low level of word line voltage $V_{WL}$ such as −12V~−8V and the bit line voltage $V_{BL}$ relatively higher than the word line voltage $V_{WL}$ such as 3V–7V are provided, keeping the drain in the suspended state and the deep P-well 406 at a voltage relatively higher than the word line voltage $V_{WL}$ and lower than the bit line voltage $V_{BL}$, such as 0V Under the operation recited above, electrons move into the source 402 and the P-type ion region 410 from the floating gate 408.

When a reading process is performed as shown in FIG. 6C, a higher level of the word line voltage $V_{WL}$ such as 2V–5V, a drain voltage $V_{DL}$ relatively lower than the word line voltage $V_{WL}$ such as 0.5V–2V, a bit line voltage $V_{BL}$ relatively lower the drain voltage $V_{DL}$ such as 0V, and a deep P-well voltage relatively lower than the drain voltage such as 0V are provided.

In a light of foregoing, the non-volatile semiconductor memory cell having divided bit lines according to the present invention is characterized by use of a bit line selection device to control the main bit line and the sub bit line, such that the sub bit line and the main bit line in a designated sector have the same voltage to prevent the bit line from being overloaded.

Furthermore, formation of the bit line selection device and memory cells on the different P-well and N-well effectively prevents the sectors from sharing the same N-well, resulting in significantly reduced disturbances when programming or erasing the bit line.

It will be apparent to those skilled in the art that various modifications and variations can be made to the structure of the present invention without departing from the scope or spirit of the invention. In view of the forgoing, it is intended that the present invention cover modifications and variations of this invention provided they fall within the scope of the following claims and their equivalents.

What is claimed is:

1. A non-volatile semiconductor memory device having divided bit lines, comprising:
   a substrate comprising an N-type region, a deep P-well and an N-well, from bottom to top;
   a plurality of memory cells located inside the N-well, wherein a designated number of the memory cells form a sector;
   at least a bit line selection device located inside the N-well and between each sector of the memory cells to control operation of any sector;
   at least an isolation structure located between the sector of the memory cells and the bit line selection device;
   a main bit line electrically connected to one end of the bit line selection device; and
   at least a sub bit line electrically connecting all memory cells in each sector to another end of the bit line selection device, respectively.

2. The memory device of claim 1, wherein each memory cell has a source, a gate and a drain, and the source comprises an N-type ion region surrounded by a P-type ion region.

3. The memory device of claim 2, wherein a short circuit connection between the source and the P-type ion region is formed.

4. The memory device of claim 3, wherein the short circuit connection is formed by a metal layer penetrating the source and the P-type ion region.

5. The memory device of claim 3, wherein the short circuit connection is formed by a metal layer connecting an exposed source to the P-type ion region.

6. The memory device of claim 2, wherein the drain comprises an N-type ion region and connects to the P-type ion region.

7. The memory device of claim 2, wherein the drain comprises an N+ ion region and an N− ion region located between the N+ ion region and the P-type ion region.

8. The memory device of claim 2, wherein the drain comprises an N+ ion region and an N− ion region surrounding the N+ ion region and connecting to the P-type ion region.

9. The memory device of claim 2, wherein the drain region comprises an N+ ion region and an N-type field oxide located between the N+ ion region and the P-type ion region.

10. The memory device of claim 1, wherein the sub bit line and the main bit line are made of metal.

11. The memory device of claim 1, wherein the sub bit line and the main bit line are made of a metallic compound.

12. The memory device of claim 1, wherein sixteen of the memory cells form a sector.

13. The memory device of claim 1, wherein more than sixteen of the memory cells form a sector.

14. The memory device of claim 1, each memory cell comprising a gate, a source and a drain, wherein a word line voltage, a bit line voltage and a drain voltage are applied thereto, respectively, wherein:
   when an erasing process is performed, a high level of word line voltage and a drain voltage relatively lower than the word line voltage are provided, keeping the bit line voltage in a suspended state and a deep P-well at a voltage relatively lower than that of the word line voltage;
   wherein when a programming process is performed, a low level of word line voltage and the bit line relatively higher than the word line voltage are provided, keeping the drain in the suspended state and the deep P-well at a voltage relatively higher than that of the word line voltage; and
   when a reading process is performed, a higher level of the word line voltage, a drain voltage relatively lower than the word line voltage, a bit line voltage relatively lower the drain voltage, and a deep P-well voltage relatively lower than the drain voltage are provided.

15. The memory device of claim 14, wherein when the erasing process is performed, the word line voltage, the drain voltage and the deep P-well voltage are respectively about 8V–12V, about −12V−−8V and about −12V−−8V.

16. The memory device of claim 14, wherein when the programming process is performed, the word line voltage, the bit line and the deep P-well voltage are respectively about −12V−−8V, about 3V–7V, and about 0V.

17. The memory device of claim 14, wherein when the reading process is performed, the word line voltage, the bit line voltage, the drain voltage and the deep P-well voltage are respectively about 2V–5V, about 0V, about 0.5–2V and about 0V.

18. A non-volatile semiconductor memory device having divided bit lines, comprising:
   a substrate comprising an N-type region, a deep P-well and a combined well, from bottom to the top, wherein the combined well comprises a P-well and an N-well in parallel;
   a plurality of memory cells located inside the N-well, wherein a designated number of the memory cells form a sector;
   at least a bit line selection device located inside the P-well and between sectors to control operation of any sector;
   at least an isolation structure located between the P-well and the N-well to isolate the sector of the memory cells from the bit line selection device;
   a main bit line electrically connected to one end of the bit line selection device; and
   at least a sub bit line electrically connecting all memory cells in each sector to another end of the bit line selection device, respectively.

19. The memory device of claim 18, wherein each memory cell has a source, a gate and a drain, and the source comprises an N-type ion region surrounded by a P-type ion region.

20. The memory device of claim 19, wherein a short circuit connection between the source and the P-type ion region is formed.

21. The memory device of claim 20, wherein the short circuit connection is formed by a metal layer penetrating the source and the P-type ion region.

22. The memory device of claim 20, wherein the short circuit connection is formed by a metal layer connecting an exposed source to the P-type ion region.

23. The memory device of claim 19, wherein the drain comprises an N-type ion region and connects to the P-type ion region.

24. The memory device of claim 19, wherein the drain comprises an N+ ion region and an N− ion region located between the N+ ion region and the P-type ion region.

25. The memory device of claim 19, wherein the drain comprises an N+ ion region and an N− ion region surrounding the N+ ion region and connected to the P-type ion region.

26. The memory device of claim 19, wherein the drain region comprises an N+ ion region and an N-type field oxide located between the N+ ion region and the P-type ion region.

27. The memory device of claim 18, wherein the sub bit line and the main bit line are made of metal.

28. The memory device of claim 18, wherein the sub bit line and the main bit line are made of a metallic compound.

29. The memory device of claim 18, wherein sixteen of the memory cells form a sector.

30. The memory device of claim 18, wherein more than sixteen of the memory cells form a sector.

31. The memory device of claim 18, each of the memory cells having a gate, a source and a drain, wherein a word line voltage, a bit line voltage and a drain voltage are applied thereto, respectively, wherein:

when an erasing process is performed, a high level of word line voltage and a drain voltage relatively lower than the word line voltage are provided, keeping the bit line voltage in a suspended state and a deep P-well at a voltage relatively lower than the word line voltage;

when a programming process is performed, a low level of word line voltage and the bit line relatively higher than the word line voltage are provided, keeping the drain in the suspended state and the deep P-well at a voltage relatively higher than the word line voltage; and when a reading process is performed, a higher level of the word line voltage, a drain voltage relatively lower than the word line voltage, a bit line voltage relatively lower the drain voltage, and a deep P-well voltage relatively lower than the drain voltage are provided.

32. The memory device of claim 31, wherein when the erasing process is performed, the word line voltage, the drain voltage and the deep P-well voltage are respectively about 8V–12V, about −12V−−8V and about −12V−−8V.

33. The memory device of claim 31, wherein when the programming process is performed, the word line voltage, the bit line and the deep P-well voltage are respectively about −12V−−8V, about 3V–7V, and about 0V.

34. The memory device of claim 31, wherein when the reading process is performed, the word line voltage, the bit line voltage, the drain voltage and the deep P-well voltage are respectively about 2V–5V, about 0V, about 0.5–2V and about 0V.

* * * * *